United States Patent [19]

Sagoh et al.

[11] 4,336,347

[45] Jun. 22, 1982

[54] PROCESS FOR PRODUCTION OF PHENOLIC RESIN MODIFIED WITH LIQUID POLYBUTADIENE

[75] Inventors: Masakazu Sagoh, Ibaraki; Takanobu Noguchi, Takatsuki; Seimei Yasui, Takarazuka, all of Japan

[73] Assignee: Sumitomo Chemical Company, Limited, Osaka, Japan

[21] Appl. No.: 192,716

[22] Filed: Oct. 1, 1980

[30] Foreign Application Priority Data

Oct. 18, 1979 [JP] Japan ................................ 54/134777

[51] Int. Cl.$^3$ ............................................. C08L 61/14
[52] U.S. Cl. .................................... 525/139; 428/521; 525/328; 528/159
[58] Field of Search ................ 525/139, 328; 528/159; 428/521

[56] References Cited

U.S. PATENT DOCUMENTS 3,887,641  6/1975  Tsuchiya et al. ................... 525/139

FOREIGN PATENT DOCUMENTS 55-102621  8/1980  Japan .

*Primary Examiner*—Theodore E. Pertilla
*Attorney, Agent, or Firm*—Birch, Stewart, Kolasch and Birch

[57] ABSTRACT

A process for the production of a phenolic resin modified with a liquid polybutadiene being useful as an impregnating varnish in the production of a copper-clad laminate for a printed circuit, which comprises preparing an adduct of a liquid polybutadiene having a number average molecular weight of 150 to 5,000 with an α, β-unsaturated dicarboxylic acid or its anhydride, subjecting the adduct to an addition reaction with one or plurality of phenols in the presence of an acid catalyst to obtain a composition and reacting the composition with formaldehyde in the presence of a basic catalyst.

21 Claims, No Drawings

PROCESS FOR PRODUCTION OF PHENOLIC RESIN MODIFIED WITH LIQUID POLYBUTADIENE

The present invention relates to a process for the production of a phenolic resin modified with a liquid polybutadiene which is useful as an impregnating varnish in the production of a copper-clad laminate for a printed circuit. More particularly, it relates to a process for the production of a phenolic resin modified with a liquid polybutadiene which comprises preparing an adduct of a liquid polybutadiene having a number average molecular weight of 150 to 5,000 with an $\alpha,\beta$-unsaturated dicarboxylic acid or its anhydride (hereinafter referred to as adduct (A)), subjecting the adduct (A) to an addition reaction with one or a plurality of phenols in the presence of an acid catalyst to obtain a composition (hereinafter referred to as composition (A)) and reacting the composition (A) with formaldehyde in the presence of a basic catalyst.

The phenolic resin modified with the liquid polybutadiene produced by the present invention has excellent solubility in an organic solvent and is suitable for using as a varnish for uniformly impregnating into a base material in the production of a laminate. A laminate produced by using the phenolic resin modified with the liquid polybutadiene of the present invention has excellent machining characteristics, particularly, punchability at a low temperature, as well as excellent chemical resistance, electrical characteristics and curing characteristics. A laminate produced according to the present invention also has various properties similar to or greater than those of a conventional phenolic resin modified with a natural drying oil such as linseed oil, tung oil, dry castor oil or the like. Furthermore, the phenolic resin modified with the liquid polybutadiene of the present invention can be produced at a low cost.

Phenolic resins have generally excellent properties, such as excellent water resistance, heat resistance and electrical characteristics, but are hard and brittle, and are therefore not used alone but are usually used in combination with other ingredients. A phenolic laminate is usually produced by impregnating a varnish of an uncured phenolic resin into a base material such as paper, cotton cloth, asbestos paper, asbestos or glass fiber cloth, drying the base material, piling up a few or several sheets of the base material thus impregnated with a varnish and then pressing with heating the resulting piled base materials to form a sheet. Phenolic laminates are widely used as an electrical insulating material. In particular, a phenolic paper laminate having a thickness of about 0.8 to 3.2 mm and a copper-clad laminate for a printed-wiring board are widely used in the field of electrical devices.

The latter copper-clad laminate is usually required to have excellent punchability at a low temperature since, when wire terminals of parts such as an electrical resistance, diode or condensor are inserted into punched holes thereof by an automatic insertion machine, an excellent dimension accuracy for punching is required. In order to provide impact resistance to a laminate, a phenolic resin to be used in an impregnating varnish is usually modified with a vegetable oil such as castor oil, tung oil, linseed oil or the like to thereby provide a flexible laminate. A representative example of the modifying agent is tung oil. But since it is a natural product, tung oil is expensive and not available at consistent prices and amounts. Moreover, owing to the molecular structure of tung oil, electrical characteristics of a laminate obtained by using a phenolic resin modified with tung oil are insufficient and the laminate has inferior dimensional stability and punchability, which results in ply separation.

On the other hand, recent developments in, electronic equipments, including miniaturization and increased performance requirements, have required an improvement in the electrical insulating properties or punchability of a laminate. Under these circumstances, it has been required to use a synthetic drying oil which can be obtained in a stable cost and amount instead of tung oil. A representative example of a synthetic drying oil is a liquid polybutadiene.

However, when a phenolic paper laminate is produced by using the liquid polybutadiene in a manner similar to that using tung oil, that is, when a phenolic resin to be used in an impregnating varnish is prepared by subjecting a phenol such as phenol or m-cresol to an addition reaction with a liquid polybutadiene in the presence of an acid catalyst such as p-toluenesulfonic acid, reacting the adduct thus obtained with formaldehyde in the presence of a basic catalyst such as aqueous ammonia or hexamethylenetetramine and then dehydrating the resultant under a reduced pressure, impregnation of a varnish of the phenolic resin into a paper base material does not provide a sufficient product. The resulting laminate is susceptible to ply separation at punching and the water resistance of the laminate is lowered.

In order to prevent the deterioration of these properties of a phenolic paper laminate, it is proposed to previously treat the paper base material with a water soluble resol and then impregnate with a varnish of a phenolic resin modified with an oil as described above. However, such a conventional process still has some defects. For example, the laminate obtained has inferior flexibility and is costly since the treatment with a water soluble resol should be repeated twice.

Furthermore, when a liquid polybutadiene is used instead of tung oil, the resulting impregnating varnish has inferior homogeneity. As described above, a phenolic laminate is produced by impregnating a base material with a varnish prepared by dissolving a phenolic resin in an organic solvent in a certain concentration, drying the impregnated base material to obtain prepreg, cutting the prepreg in a certain size, piling up some sheets of the prepreg and then pressing them with heating. In this impregnation step of a base material with an impregnating varnish, if a phenolic resin is not homogeneously dispersed in an organic solvent, the resin is not uniformly impregnated into a base material thus causing undesirable phenomena such as deposition of the resin on a surface of perpreg and thin spot at pressing. Moreover, if an impregnating varnish having inferior homogeneity is stored in a tank, it is liable to precipitate or to separate into layers and it is difficult to keep the varnish in a certain quality when it is fed from the tank to a manufacturing line.

The main object of the present invention is to provide a novel process for the production of a phenolic resin modified with a liquid polybutadiene which is suitable for use as an impregnating varnish in the production of a phenolic laminate. This object as well as other objects and advantages of the present invention will become apparent to those skilled in the art from the following description.

According to the present invention, the adduct (A) of a liquid polybutadiene having a number average molecular weight of 150 to 5,000 with an α,β-unsaturated dicarboxylic acid or its anhydride is used instead of tung oil which has hitherto been used to provide flexibility to a phenolic laminate. The phenolic resin modified with the liquid polybutadiene of the present invention has improved solubility in organic solvents, particularly, in alcohols and improved miscibility with a water soluble resol. Thus, according to the present invention, an impregnating varnish having excellent homogeneity and stability can be obtained and a phenolic laminate can be produced at a low cost since treatment of a base material with a water soluble resol can be effected in one step. Further, the use of the adduct (A) remarkably improves electrical characteristics and punchability of the obtained laminate.

The liquid polybutadiene used in the present invention has preferably a viscosity of 50 to 5,000 cps at 20° C., particularly 50 to 1,000 cps at 20° C., a number average molecular weight of 150 to 5,000, particularly 600 to 2,000 (measured by a vapor pressure osmometry) and an iodine value of 400 iodine/100 g or more. When the number average molecular weight of the liquid polybutadiene is lower than 150, chemical resistance and heat resistance of the laminate obtained is lowered, and when it is more than 5,000, impregnation of the varnish obtained into a base material is insufficient.

The microstructure of double bonds of the liquid polybutadiene used in the present invention is not critical, but it is preferable to use the liquid polybutadiene being rich in 1,4-double bonds in view of punchability of the laminate obtained.

The adduct (A) of a liquid polybutadiene having a number average molecular weight of 150 to 5,000 with an α,β-unsaturated dicarboxylic acid or its anhydride can be prepared by a known method. For example, the adduct (A) can be prepared by mixing a conjugated diene polymer and an α,β-unsaturated carboxylic acid or its anhydride and reacting them at 50° to 300° C. for 30 minutes to 20 hours. When an anti-gelling agent is needed, it is added to the reaction in an amount of 0.01 to 10% by weight, preferably, 0.01 to 2% by weight.

Examples of the α,β-unsaturated dicarboxylic acid or its anhydride are maleic acid, fumaric acid, itaconic acid, citraconic acid, an anhydride thereof and the like. Particularly, an anhydride thereof is preferable.

The α,β-unsaturated dicarboxylic acid or its anhydride is used in such an amount that the content thereof in the adduct (A) is 0.5 to 30% by weight, preferably, 3 to 20% by weight. When the content is lower than 0.5% by weight, the adduct (A) is liable to be excessively polymerized through the liquid polybutadiene backbone thereof in the preparation step of the composition (A) by subjecting the adduct (A) to an addition reaction with a phenol and the resin modified with a liquid polybutadiene obtained has inferior solubility in an organic solvent and impregnation thereof into a base material is insufficient. On the other hand, when the content is more than 30% by weight, since the impregnating varnish obtained has high viscosity, the varnish is liable to deposit on a surface of prepreg and workability thereof will become inferior.

The composition (A) prepared by subjecting the adduct (A) to an addition reaction with one or a plurality of phenols comprises an addition product of the adduct (A) with the phenols and unreacted phenols.

In the present invention, the composition (A) contains preferably the addition product of a specific ratio of the adduct (A) and a phenol, used in the preparation thereof. That is, one molecule of the phenol per 3 to 15 units of the butadiene monomer which composes the liquid polybutadiene. For example, in case of a liquid polybutadiene having a number average molecular weight of 1,200, it is preferable to add the phenol to the adduct (A) in the ratio of 1.5 to 7.4 molecules of the phenol per one molecule of the liquid polybutadiene. When the addition molecular number of the phenol is lower than one molecule per 15 units of the butadiene monomer of the liquid polybutadiene, the resol product gives uneven cured product by curing at 160° C. for 20 minutes. On the other hand, when the addition molecular number of the phenol is more than one molecule per 3 units of the butadiene monomer of the liquid polybutadiene, the composition (A) has a too high viscosity, which results in an inferior workability and less impregnating properties into the base material and also inferior punchability of the laminate.

The phenol to be used includes monovalent or polyvalent phenols such as phenol, an alkylphenol having 1 to 20 carbon atoms in the alkyl moiety (e.g. cresol, xylenol, n-propylphenol, isopropylphenol, butylphenol, nonylphenol, dodecylphenol, stearylphenol etc.), resorcinol, hydroquinone, catechol, saligenin and the like, which may be used alone or in a combination of two or more thereof.

The acid catalyst to be used in addition reaction of the adduct (A) and phenols includes mineral acids such as sulfuric acid, hydrochloric acid or the like, sulfonic acids such as p-toluenesulfonic acid, Lewis acids such as aluminum chloride, ferric chloride, boron trifluoride or the like, a complex of a Lewis acid such as boron trifluoride-phenol complex or the like and a combination of two or more thereof. The amount of the acid catalyst is not critical, but it is usually used in an amount of 0.01 to 10% by weight based on the total amount of the reaction mixture.

The reaction of the adduct (A) and phenols may optionally be carried out in the presence of a solvent. The solvent has preferably a dielectric constant of not higher than 15, more preferably not higher than 10, at 25° C. Examples of the solvent are hydrocarbons such as benzene, toluene, xylene, n-heptane, n-hexane, cyclohexane or the like and halogenated hydrocarbons such as monochlorobenzene, dichlorobenzene or the like.

The reaction temperature of the addition reaction of the adduct (A) and the phenol is not critical, but is preferably in the range of 40° to 170° C.

The basic catalyst to be used in the reaction of the composition (A) and formaldehyde includes ammonia, amines such as hexamethylenetetramine, trimethylolamine, ethylenediamine, n-butylamine, dimethylamine, diethylamine, trimethylamine, triethylamine or the like and hydroxides such as sodium hydroxide, potassium hydroxide, barium hydroxide or the like, which may be used alone or in a combination of two or more thereof. The amount of the basic catalyst is not critical, but it is usually used in an amount of 0.001 to 0.5 mole per 1 mole of the phenol used for the preparation of the composition (A).

Formaldehyde to be reacted with the composition (A) may be in the form of formalin, a highly concentrated formalin named "formit" or paraformaldehyde. When formaldehyde is used to an amount of lower than 0.6 mole per 1 mole of the phenol used for the preparation of the composition (A), the reaction of the composition (A) and formaldehyde, that is, the methylol group-introducing reaction, cannot sufficiently be accomplished, therefore, the laminate obtained by using such a phenolic resin modified with the liquid polybutadiene has inferior characteristics, particularly, inferior curing characteristics and inferior solvent resistance. On the other hand, when it is used in an amount of more than 2.0 mole, the methylol group-introducing reaction proceeds too rapidly, and hence, it is difficult to control the reaction and to obtain an impregnating varnish having stable homogeneity.

The reaction of the composition (A) and formaldehyde is preferably carried out at a temperature of 60° to 120° C. for 30 to 300 minutes. After dehydration under a reduced pressure, the reaction product is diluted with an appropriate solvent to obtain the desired impregnating varnish of the phenolic resin modified with the liquid polybutadiene.

The reaction of the composition (A) and formaldehyde, i.e. methylol group-introducing reaction is preferably carried out in an appropriate solvent. The solvent include hydrocarbons, halogenated hydrocarbons, alcohols, ketones, esters and the like. Examples of the hydrocarbons are benzene, toluene, xylene, durene, hexane, heptane, pentane, octane or the like. Examples of the halogenated hydrocarbons are monochlorobenzene, monobromobenzene, dichlorobenzene, dichloroethane, perchloroethylene, hexyl chloride, octyl chloride or the like. In particular, benzene, toluene and xylene are preferable from the practical and economical viewpoints.

The preferred alcohols are those having 1 to 27 carbon atoms, for example, methyl alcohol, ethyl alcohol, n-propyl alcohol, isopropyl alcohol, n-butyl alcohol, isobutyl alcohol, sec-butyl alcohol, tert-butyl alcohol, n-amyl alcohol, sec-amyl alcohol, diethylmethanol, isoamyl alcohol, tert-amyl alcohol, tert-bytylmethanol or the like.

Examples of ketones are acetone, diethyl ketone, dipropyl ketone, cyclohexanone or the like. Examples of esters are ethyl formate, ethyl acetate, isoamyl acetate, ethyl butyrate or the like.

In case of using a mixture of a hydrocarbon and an alcohol as the solvent, up to 100 parts by weight, preferably, up to 5 parts by weight of the alcohol is mixed with one part of the hydrocarbon. The solvent is used in an amount of 1 to 2,000 parts by weight, preferably, 20 to 500 parts by weight per 100 parts by weight of the composition (A).

For producing a laminate by using the phenolic resin modified with the liquid polybutadiene of the present invention, the resin is firstly dissolved in an appropriate solvent in a certain concentration to obtain an impregnating varnish. Examples of the solvent are alcohols, ethers, ketones, esters and the like. Suitable examples of the solvents are the same as listed above. Among them, toluene, methanol and acetone are preferable from the practical and economical viewpoints.

The varnish thus obtained can be used alone or in a combination thereof with a conventional varnish of a phenol-formaldehyde resin.

The varnish of a phenol-formaldehyde resin to be used together with the varnish of the phenolic resin modified with the liquid polybutadiene of the present invention can be produced by reacting one or a plurality of phenols with formaldehyde in the presence of a basic catalyst. Examples of the phenol to be used are phenol, cresol, xylenol, n-propylphenol, isopropylphenol, butylphenol, nonylphenol, octylphenol, cashew shell liquid, urushiol or the like, which may be used alone or in a combination of two or more thereof. Formaldehyde may be in the form of formalin, a highly concentrated formalin or paraformaldehyde and is preferably used in an amount of 1.0 to 2.0 mole per one mole of the phenol. Examples of the basic catalyst is ammonia, amines such as hexamethylenetetramine, ethylenediamine, n-butylamine, dimethylamine, diethylamine, trimethylamine, triethylamine or the like and hydroxides such as sodium hydroxide, potassium hydroxide, barium hydroxide or the like.

Two or more of phenol-formaldehyde resin varnishes thus obtained can also be used together with the varnish of the phenolic resin modified with the liquid polybutadiene of the present invention.

However, in any case of impregnating the resulting varnish containing the phenolic resin modified with the liquid polybutadiene alone or a mixture thereof with one or plurality of phenol-formaldehyde resins into a base material, the impregnating varnish preferably contains the liquid polybutadiene in an amount of 5 to 70% by weight based on the resin in the varnish.

When the content of the liquid polybutadiene is lower than 5% by weight, the resulting laminate has insufficient flexibility. On the other hand, when the content is more than 70% by weight, the resulting laminate has inferior heat resistance and solvent resistance.

The desired laminate can be produced by impregnating the varnish of the phenolic resin modified with the liquid polybutadiene or a mixture thereof with one or a plurality of phenol-formaldehyde resins into a base material such as paper, cotton cloth, asbestos paper, asbestos or glass fiber cloth or the like, drying the impregnated base material to obtain prepreg, piling up a few or several sheets of the prepreg and then pressing the piled prepreg with heating.

The laminate thus obtained is also included in the scope of the present invention.

The present invention is illustrated by the following examples, but is not limited thereto.

EXAMPLES 1 TO 6

The resol resins used herein were prepared as follows:

(1) Preparation of adduct (A)

(i) Preparation of adduct (A)-1

Maleic anhydride (40.6 g) and a liquid polybutadiene (540 g) which had a viscosity of 230 cps at 20° C., a number average molecular weight of 1,110 (measured by a vapor pressure osmometer), cis-1,4 structure of not lower than 70% and vinyl structure of not more than 3% were placed in a 1,000 ml three-naked flask equipped with a stirrer, a thermometer and a three-way cock for gas seal and, after passing nitrogen gas through the flask to displace air, they were reacted at 190° C. for 4 hours under nitrogen atmosphere to obtain the adduct (A)-1.

(ii) Preparation of adduct (A)-2

According to the same procedure as described in the above (i), the adduct (A)-2 was prepared by using maleic anhydride (60 g) and the liquid polybutadiene (540 g).

(2) Preparation of composition (A)

(i) Preparation of composition (A)-1

A mixture of phenol (400 g), toluene (150 g) and boron trifluoride-phenol complex (1.4 ml) was heated at 85° C. and thereto added the above-obtained adduct (A)-1 (350 g) with stirring by portions over 30 minutes. Stirring was further continued at 90° C. for 40 minutes and the reaction was quenched by addition of triethylamine (1.4 ml) to obtain the composition (A)-1. It was analytically confirmed that the composition (A)-1 was a mixture of an addition product of the adduct (A)-1 with phenol, which was the maleic liquid polybutadiene-phenol adduct, and unreacted phenol, in said addition product, 3.5 molecules of phenol in average being added to one molecule of the liquid polybutadiene (i.e. one molecule of phenol per 5.8 butadiene units).

(ii) Preparation of composition (A)-2

A mixture of phenol (400 g), toluene (150 g) and boron trifluoride-phenol complex (1.4 ml) was heated at 85° C. and thereto added the above-obtained adduct (A)-2 (350 g) with stirring by portions over 30 minutes. Stirring was further continued at 90° C. for 40 minutes and the reaction was quenched by addition of triethylamine (1.4 ml) to obtain the composition (A)-2. It was analytically confirmed that the composition (A)-2 was a mixture of an addition product of the adduct (A)-2 and phenol, which was a maleic liquid polybutadiene-phenol adduct, and unreacted phenol, in said addition product, 4 molecules of phenol in average being added to one molecule of the liquid polybutadiene (i.e. one molecule of phenol per 5.1 butadiene units).

(iii) Preparation of composition (A)-3

A mixture of phenol (80 g), p-nonylphenol (80 g), m-cresol (80 g) and boron trifluoride-phenol complex (0.5 ml) was heated at 85° C. and thereto added the above-obtained adduct (A)-1 (80 g). The resulting mixture was stirred at 90° C. for 40 minutes and the reaction was quenched by addition of triethylamine (0.5 ml) to obtain the composition (A)-3. It was analytically confirmed that the composition (A)-3 was a mixture of an adduct of the maleic liquid polybutadiene, phenol, p-nonylphenol and m-cresol and unreacted these phenols, in said adduct, 4.5 molecules of the phenols in average being added to one molecule of the liquid polybutadiene (i.e. one molecule of the phenols per 4.6 butadiene units).

(3) Preparation of varnish of resol modified with liquid polybutadiene (i) Preparation of varnish (A)-1 of resol modified with liquid polybutadiene To the above-obtained composition (A)-1 (400 g) were added paraformaldehyde (80 g), toluene (133 g), isopropanol (67 g) and 28% aqueous ammonia (20 g) and the mixture was reacted with stirring at 80° to 85° C. for 3 hours. When a sample of the reaction mixture was analyzed, it contained unreacted phenol corresponding to 30% of the total amount of phenol used in the preparation of the composition (A)-1.

After the reaction, the reaction mixture was concentrated under a reduced pressure. The concentrated mixture was dissolved in a mixed solvent of toluene-methanol (2:1 by weight) to obtain the varnish (A)-1 of the resol modified with the liquid polybutadiene, the nonvolatile content of which was 52% by weight.

(ii) Preparation of varnish (A)-2 of resol modified with liquid polybutadiene

According to the same procedure as described in the above preparation of the varnish (A)-1, the varnish (A)-2 of the resol modified with the liquid polybutadiene was prepared by using the composition (A)-2.

(iii) Preparation of varnish (A)-3 of resol modified with liquid polybutadiene

To the above-obtained composition (A)-3 (150 g) were added paraformaldehyde (32 g), toluene (71 g), isopropanol (24 g) and 28% aqueous ammonia (8 g) and the mixture was reacted with stirring at 80° to 85° C. for 3 hours. When a sample of the reaction mixture was analyzed, it contained unreacted phenols corresponding to 30% of the total amount of the phenols used in the preparation of the composition (A)-3.

After the reaction, the reaction mixture was concentrated under a reduced pressure and dissolved in a mixed solvent of toluene-methanol (2:1 by weight) to obtain the varnish (A)-3 of the resol modified with the liquid polybutadienethe, non-volatile content of which was 52% by weight.

(4) Preparation of varnish of phenol-formaldehyde resin (i) Preparation of varnish (B) of phenolformaldehyde resin Phenol (450 g), p-nonylphenol (450 g), 37% formalin (900 g) and 28% aqueous ammonia (36 g) were reacted with stirring at 90° to 95° C. for 3 hours. The reaction mixture was concentrated under a reduced pressure and dissolved in a mixed solvent of toluene-methanol (2:1 by weight) to obtain the varnish (B) of the phenol-formaldehyde resin, the nonvolatile content of which was 52% by weight.

(ii) Preparation of varnish (C) of phenolformaldehyde resin

Phenol (500 g), formalin (495 g) and triethylamine (9 g) were reacted with stirring at 65° to 70° C. for 3 hours. The reaction mixture was concentrated under a reduced pressure and dissolved in methanol to obtain the varnish (C) of the phenol-formaldehyde resin, the nonvolatile content of which was 50% by weight.

The resulting varnishes were formulated according to the proportions shown in Table 1 to obtain impregnating varnishes. In Table 1, the numbers mean parts by weight.

TABLE 1

| Varnish | Example No. | | | | | |
|---|---|---|---|---|---|---|
| | 1 | 2 | 3 | 4 | 5 | 6 |
| Varnish (A)-1 | 100 | 100 | 100 | — | — | — |
| Varnish (A)-2 | — | — | — | 100 | 100 | — |
| Varnish (A)-3 | — | — | — | — | — | 100 |
| Varnish (B) | 100 | 100 | 100 | 100 | 50 | — |
| Varnish (C) | — | 40 | 20 | 40 | 40 | — |

Each impregnating varnish thus obtained had excellent homogeneity and, when it was cured in an oven at 160° C. for 20 minutes, it formed a homogeneous cured product.

A kraft paper was impregnated with each impregnating varnish thus obtained and dried to obtain prepreg (impregnating resin content: 52% by weight).

Eight sheets of prepreg thus obtained and one sheet of adhesive-backed copper foil having a thickness of 35μ, the adhesive-backed surface of which was faced to the outer surface of the uppermost prepreg were piled up and heat-pressed at 160° C. under a pressure of 80 to 100 kg/cm² for 60 minutes to obtain a copper-clad laminate having a thickness of 1.6 mm.

The properties of each copper-clad laminate thus obtained are shown in Table 2. In Table 2, data of insulation resistance, water absorption, heat resistance in soldering and trichlene resistance were obtained according to JIS C 6481. Data of punchability were obtained according to ASTM D 617-70.

However, all of the resulting impregnating varnishes has inferior homogeneity and, when they were cured in an oven at 160° C. for 20 minutes, they formed uneven uncured products.

TABLE 2

| Properties | | Example 1 | Example 2 | Example 3 | Example 4 | Example 5 | Example 6 |
|---|---|---|---|---|---|---|---|
| Insulation resistance (Ω) | C-90/20/65 | $2.2 \times 10^{12}$ | $3.5 \times 10^{12}$ | $4.9 \times 10^{12}$ | $3.1 \times 10^{12}$ | $1.8 \times 10^{12}$ | $2.9 \times 10^{12}$ |
| | C-90/20/65 + D-2/100 | $4.1 \times 10^8$ | $6.8 \times 10^8$ | $7.1 \times 10^8$ | $6.2 \times 10^8$ | $8.3 \times 10^8$ | $4.8 \times 10^8$ |
| Water absorption (%) | E-24/50 + D-24/23 | 1.4 | 1.3 | 1.1 | 1.2 | 1.4 | 1.2 |
| Heat resistance in soldering (sec) | Bath of solder at 260° C. | 24 | 34 | 32 | 30 | 27 | 35 |
| Trichlene resistance | Biled for 30 minutes | Not changed | Not changed | Not changed | Not changed | Not changed | Not changed |
| Punchability at 50–70° C. | ASTM D 617-70 | Very good | Very good | Very good | Very good | Very good | Very good |

REFERENCE EXAMPLE

A mixture of phenol (400 g), toluene (150 g) and boron trifluoride-phenol complex (1.4 ml) was heated at 85° C. and thereto added the same liquid polybutadiene (350 g) as used in the preparation of the above adduct (A)-1 with stirring by portions over 30 minutes. Stirring was further continued at 90° C. for 40 minutes and the reaction was quenched by addition of triethylamine (1.4 ml) to obtain a composition (B)-1. It was analytically confirmed that the composition (B)-1 was a mixture of an adduct of the liquid polybutadiene with phenol and unreacted phenol, in said adduct, 4.2 molecules of phenol in average being added to one molecule of the liquid polybutadiene (i.e. one molecule of phenol per 4.9 butadiene units).

To the composition (B)-1 (400 g) were added paraformaldehyde (80 g), toluene (133 g), isopropanol (67 g) and 28% aqueous ammonia (20 g) and the mixture was reacted with stirring at 80° to 85° C. for 3 hours. When a sample of the reaction mixture was analyzed, it contained unreacted phenol corresponding to 30% of the total amount of phenol used in the preparation of the composition (B)-1.

After the reaction, the reaction mixture was concentrated under a reduced pressure. When the concentrated mixture was dissolved in a mixed solvent of toluene-methanol (2:1 by weight), it was clouded. Then, the concentrated mixture was dissolved in a mixed solvent of toluene-methanol (3:1 by weight) to obtain a varnish (D)-1 of the resol modified with the liquid polybutadiene, the nonvolatile content of which was 52% by weight. However, the varnish (D)-1 formed white precipitation when it was allowed to stand at room temperature for 3 days.

Further, the varnish (D)-1 was mixed with the varnishes obtained in the above Examples according to the proportions shown in Table 3. In Table 3, the numbers mean parts by weight.

TABLE 3

| Varnish | 1 | 2 | 3 |
|---|---|---|---|
| Varnish (D)-1 | 100 | 100 | 100 |
| Varnish (B) | 100 | 100 | 100 |
| Varnish (C) | — | 40 | 20 |

What is claimed is:

1. A process for the production of a phenolic resin modified with a liquid polybutadiene which comprises reacting a liquid polybutadiene having a number average molecular weight of 150 to 5,000 with an α,β-unsaturated dicarboxylic acid or its anhydride to obtain an adduct (A), subjecting the adduct (A) to an addition reaction with one or a plurality of phenols in the presence of an acid catalyst to obtain a composition (A) and then reacting the composition (A) with formaldehyde in the presence of a basic catalyst.

2. A process according to claim 1, wherein the liquid polybutadiene has a viscosity of 50 to 5,000 cps at 20° C. and an iodine value of 400 iodine/100 g or more.

3. A process according to claim 2, wherein the liquid polybutadiene has a viscosity of 50 and 1,000 cps at 20° C. and a number average molecular weight of 600 to 2,000.

4. A process according to claim 1, wherein the α,β-unsaturated dicarboxylic acid or its anhydride is a member selected from the group consisting of maleic acid, fumaric acid, itaconic acid, citraconic acid and an anhydride thereof.

5. A process according to claim 1, wherein the α,β-unsaturated dicarboxylic acid anhydride is used.

6. A process according to claim 1, wherein the reaction of the liquid polybutadiene and the α,β-unsaturated dicarboxylic acid or its anhydride is carried out at 50° to 300° C. for 30 minutes to 20 hours.

7. A process according to claim 1, wherein the α,β-unsaturated dicarboxylic acid or its anhydride is used in such an amount that the content thereof in the adduct (A) is 0.5 to 30% by weight.

8. A process according to claim 1, wherein the phenol is a member selected from the group consisting of phenol, cresol, xylenol, n-propylphenol, isopropylphenol, butylphenol nonylphenol, dodecylphenol, stearylphenol, resorcinol, hydroquinone, catechol and saligenin.

9. A process according to claim 1, wherein the acid catalyst is a member selected from the group consisting of sulfuric acid, hydrochloric acid, p-toluene-sulfonic acid, aluminum chloride, ferric chloride, boron trifluoride and boron trifluoride-phenol complex.

10. A process according to claim 1, wherein the acid catalyst is used in an amount of 0.01 to 10% by weight based on the total amount of the reaction mixture.

11. A process according to claim 1, wherein the composition (A) contains an addition product of the adduct (A) and the phenol in the ratio of one molecule of the phenol per 3 to 15 units of the butadiene monomer which composes the liquid polybutadiene.

12. A process according to claim 1, wherein the addition reaction is carried out at 40° to 170° C.

13. A process according to claim 1, wherein the addition reaction is carried out in the absence of a solvent.

14. A process according to claim 1, wherein the addition reaction is carried out in the presence of a solvent.

15. A process according to claim 14, wherein the solvent is a member selected from the group consisting of benzene, toluene, xylene, n-heptene, n-hexane, cyclohexane, monochlorobenzene and dichlorobenzene.

16. A process according to claim 1, wherein formaldehyde is used in an amount of 0.6 to 2.0 mole per 1 mol of the phenol used for the preparation of the composition (A).

17. A process according to claim 1, wherein the basic catalyst is a member selected from the group consisting of ammonia, hexamethylenetetramine, trimethylolamine, ethylenediamine, n-butylamine, dimethylamine, diethylamine, trimethylamine, triethylamine, sodium hydroxide, potassium hydroxide and barium hydroxide.

18. A process according to claim 1, wherein the basic catalyst is used in an amount of 0.001 to 0.5 mole per 1 mole of the phenol used for the preparation of the composition (A).

19. A process according to claim 1, wherein the reaction of the composition (A) and formaldehyde is carried out at 60° to 120° C. for 30 to 300 minutes.

20. A process according to claim 1, wherein the reaction of the composition (A) and formaldehyde is carried out in the presence of a solvent.

21. A process according to claim 20, wherein the solvent is a member selected from the group consisting of benzene, toluene, xylene, durene, hexane, heptane, pentane, octane, monochlorobenzene, monobromobenzene, dichlorobenzene, dichloroethane, perchloroethylene, hexyl chloride, octyl chloride, methyl alcohol, ethyl alcohol, n-propyl alcohol, isopropyl alcohol, n-butyl alcohol, isobutyl alcohol, sec-butyl alcohol, tert-butyl alcohol, n-amyl alcohol, sec-amyl alcohol, diethylmethanol, isoamyl alcohol, tert-amyl alcohol, tert-butylmethanol, acetone, diethyl ketone, dipropyl ketone, cyclohexanone, ethyl formate, ethyl acetate, isoamyl acetate and ethyl butyrate.

* * * * *